(12) United States Patent
Zhang et al.

(10) Patent No.: US 12,063,129 B2
(45) Date of Patent: Aug. 13, 2024

(54) FREQUENCY DETECTOR FOR CLOCK DATA RECOVERY

(71) Applicant: XILINX, INC., San Jose, CA (US)

(72) Inventors: Hongtao Zhang, San Jose, CA (US);
Winson Lin, San Francisco, CA (US);
Arianne Roldan, Los Gatos, CA (US);
Yohan Frans, Palo Alto, CA (US);
Geoff Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/665,477

(22) Filed: Feb. 4, 2022

(65) Prior Publication Data

US 2022/0231889 A1 Jul. 21, 2022

Related U.S. Application Data

(63) Continuation of application No. 16/903,377, filed on Jun. 17, 2020, now Pat. No. 11,245,554.

(51) Int. Cl.
*H04L 25/03* (2006.01)
*H03L 7/089* (2006.01)
*H04L 27/01* (2006.01)

(52) U.S. Cl.
CPC ...... *H04L 25/03057* (2013.01); *H03L 7/0891* (2013.01); *H04L 27/01* (2013.01); *H04L 2025/0349* (2013.01)

(58) Field of Classification Search
CPC .............................................. H04L 25/03057
USPC ........................................................ 375/233
See application file for complete search history.

(56) References Cited

U.S. PATENT DOCUMENTS

| 8,582,409 | B1 * | 11/2013 | Liu .................... G11B 19/28 |
| | | | 369/47.28 |
| 8,923,463 | B1 | 12/2014 | Jenkins et al. |
| 8,958,513 | B1 | 2/2015 | Novellini et al. |
| 9,065,601 | B1 | 6/2015 | Jenkins et al. |
| 9,209,960 | B1 | 12/2015 | Leung et al. |
| 9,306,730 | B1 | 4/2016 | Shu et al. |
| 9,313,017 | B1 | 4/2016 | Liao et al. |
| 9,356,775 | B1 | 5/2016 | Xu et al. |
| 9,378,720 | B2 | 6/2016 | Roebke |
| 9,379,880 | B1 | 6/2016 | Xu et al. |
| 9,397,824 | B1 * | 7/2016 | Hoshyar ............. H04L 27/01 |

(Continued)

OTHER PUBLICATIONS

Ismail, Kareem et al., "Design and Implementation of CDR and SerDes for High Speed Optical Communication Networks Using FPGA", 2016 18th International Conference on Transparent Optical Networks (ICTON), 2016, pp. 1-3.

(Continued)

*Primary Examiner* — Lihong Yu
(74) *Attorney, Agent, or Firm* — Patterson + Sheridan, LLP

(57) ABSTRACT

An example method for clock and data recovery (CDR) includes generating, in a set of slicers of a receiver, in addition to a data signal and a first error signal, at least one additional error signal. The method further includes receiving, at a frequency detector (FD) of a CDR unit of the receiver, the data signal, the first error signal, and the at least one additional error signal, and processing them to generate a FD output. The method still further includes multiplying the FD output by a user-defined FD gain, and adding the FD output, as multiplied by the FD gain, in a frequency path of the CDR unit.

18 Claims, 9 Drawing Sheets

(56) References Cited

U.S. PATENT DOCUMENTS

| | | | |
|---|---|---|---|
| 9,438,409 | B1 | 9/2016 | Liao et al. |
| 9,455,848 | B1 | 9/2016 | Zhang et al. |
| 9,698,970 | B1 | 7/2017 | Cho |
| 9,882,703 | B1 | 1/2018 | Xu et al. |
| 9,960,902 | B1 | 5/2018 | Lin et al. |
| 10,038,545 | B1 | 7/2018 | Wu et al. |
| 10,224,937 | B1 | 3/2019 | Wu et al. |
| 10,256,968 | B1 | 4/2019 | Wu et al. |
| 10,484,167 | B2 | 11/2019 | Zhuang et al. |
| 11,245,554 | B1 * | 2/2022 | Zhang .................. H03L 7/0891 |
| 2007/0258517 | A1 * | 11/2007 | Rollings ........... H04L 25/03057 375/233 |
| 2012/0109356 | A1 * | 5/2012 | Kong ..................... H04L 7/033 700/121 |
| 2013/0070835 | A1 | 3/2013 | Sindalovsky et al. |
| 2015/0103961 | A1 | 4/2015 | Malipatil et al. |
| 2018/0302264 | A1 * | 10/2018 | Liao ..................... H04L 7/0062 |
| 2020/0092077 | A1 * | 3/2020 | Abramzon .............. H04L 7/033 |

OTHER PUBLICATIONS

Understanding and Characterizing Timing Jitter, retrieved from https://www.tek.com/primer/understanding-and-characterizing-timing-jitter-primer, 24 pages.

Baprawski, J. (Mar. 22, 2012), "SerDes System CTLE Basics", retrieved from https://johnbaprawski.com/wp-content/uploads/2012/04/SerDes_System_CTLE_Basics.pdf, 10 pages.

* cited by examiner

| Vote_e(k) 412 | Vote(k) 410 | Vote_I(k) 411 | State 510 |
|---|---|---|---|
| < 0 | < 0 | < 0 | 0 |
| < 0 | < 0 | >= 0 | 1 |
| == 0 | >= 0 | >= 0 | 2 |
| >= 0 | >= 0 | >= 0 | 3 |
| | Else | | 4 |

FIG. 5

| State Transition 601 | FD Output 605 |
| --- | --- |
| 0 --> 3 | -1 |
| 3 --> 0 | 1 |
| Else | 0 |

810 — Generate, in a set of slicers of a receiver, a data signal d(k), an error signal $e_k$, an early error signal, $e_{ke}$ and a late error signal $e_{kl}$, where:
$e_k = \text{sign}[y_k - d_{k+1}*(h_1) - d_k*h_0]$,
$e_{ke} = \text{sign}[y_k - d_{k+1}*(h_1 + h_{1e0}) - d_k*h_0]$, and
$e_{kl} = \text{sign}[y_k - d_{k+1}*(h_1 + h_{1l0}) - d_k*h_0]$,
Where $h_1$ is a co-efficient of the DFE, and $h_{1e0}$ and $h_{1l0}$ are early and late offsets, respectively, relative to $h_1$

820 — Receive, at a frequency detector (FD) of the CDR, the d(k) signal and each of the error signals $e_k$, $e_{ke}$ and $e_{kl}$ and respectively process the early and late error signals to generate corresponding phase voting signals vote_e(k) and vote_l(k):
vote_e(k) = $\text{sign}(e_{ke} * (d_{k-1} - d_{k+1}))$ and
vote_l(k) = $\text{sign}(e_{kl} * (d_{k-1} - d_{k+1}))$

830 — Generate a state from the vote_e(k) and vote_l(k) signals in combination with a vote(k) signal = $\text{sign}(e_k * (d_{k-1} - d_{k+1}))$, the vote(k) signal generated from the $e_k$ signal, wherein in a first state all three signals are negative, and in a final state all three signals are positive, and in intermediate states the three signals are a mix of positive and negative

840 — Generate an FD output of: 1 when the state changes from the first state to the final state, -1 when the state changes from the final state to the first state, and 0 for any other state change, or for no state change.

850 — Add the FD output in an integral path of the CDR

FIG. 8

FREQUENCY DETECTOR FOR CLOCK DATA RECOVERY

CROSS-REFERENCE TO RELATED APPLICATION

This application is a continuation of U.S. non-provisional patent application Ser. No. 16/903,377 filed Jun. 17, 2020 of which is incorporated herein by reference in its entirety.

TECHNICAL FIELD

Examples of the present disclosure generally relate to electronic circuits and, in particular, to a frequency detector for clock data recovery (CDR).

BACKGROUND

High-speed data communication systems frequently rely on circuits within the receiver rather than transmitting a reference dock with the data. For example, serial data communication may include the use of a serializer-deserializer (SerDes) at each end of a communication link. Within a SerDes, CDR circuitry may extract a dock that is embedded in the incoming data stream. Once the dock is recovered, it may then be used to sample the incoming data stream to recover individual bits. A conventional CDR implementation in a receiver includes a phase detector (PD), whose output splits into two paths, a first order phase path, and a second order frequency path. The two respective paths are then joined at a summer, and the output of the summer provided to a phase interpolator (PI). In a CDR locked state, the phase path tracks the instantaneous phase difference between the received data and the local clock within its loop bandwidth and loop gain range. Similarly, in the CDR locked state, the frequency path periodically updates the PI to track an averaged frequency offset within its tracking range. However, the CDR's PD only provides phase difference information, and can generally only track a small frequency difference, measured by parts per million (ppm). When the frequency difference between the transmitted signal and the local clock is outside the CDR's frequency capture range (typically near the CDR bandwidth at a few MHz, corresponding to a couple hundred ppm at 50+Gbps) using the PD, the CDR will lose lock due to limited CDR bandwidth and the link would fail. This is typical for analog to digital converter (ADC) based designs where the loop latency limits the CDR bandwidth. If the loop latency is high, then higher CDR bandwidth will cause the loop to become unstable.

What is desired is an improved CDR that has a broader frequency acquisition range.

SUMMARY

Techniques for detecting a frequency offset, and using the frequency offset in clock recovery are described. In an example, a method of clock and data recovery (CDR) includes generating, in a set of slicers of a receiver, in addition to a data signal and a first error signal, at least one additional error signal. The method further includes receiving, at a frequency detector (FD) of a CDR unit of the receiver, the data signal, the first error signal, and the at least one additional error signal, and processing them to generate a FD output. The method still further includes multiplying the FD output by a user-defined FD gain, and adding the FD output, as multiplied by the FD gain, in a frequency path of the CDR unit.

In another example, a CDR circuit includes a set of slicers configured to receive a serial data stream and generate a data signal $d_k$, a first error signal $e_k$ and at least one additional error signal. The CDR circuit further includes a phase detector coupled to the set of slicers, including an input configured to receive the data signal and the first error signal and an output coupled to a phase path and a frequency path. The CDR circuit still further includes a frequency detector (FD) coupled to the set of slicers, the FD configured to receive the data signal, the first error signal and the at least one additional error signal from the set of slicers, and to output a frequency vote. The CDR circuit yet further includes a multiplier, coupled to the FD and to the frequency path, configured to receive the frequency vote and multiply it by a pre-determined frequency detector gain, and output the frequency vote product to the frequency path.

In still another example, a method of CDR recovery includes receiving a pre-defined number of successive votes from a frequency detector (FD) of a second-order loop of a CDR circuit, and determining if the average value of the votes over the pre-defined number of successive votes indicates that the CDR circuit has locked onto, within a pre-defined threshold, a frequency of an incoming data stream. The method further includes, based at least in part on the determination, outputting a control signal to the CDR circuit.

These and other aspects may be understood with reference to the following detailed description.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 5 is a truth table to determine a frequency state according to an example.

FIG. 6 is a state transition table to generate a FD output according to an example.

FIG. 8 is a flow diagram depicting an alternate method of clock and data recovery according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
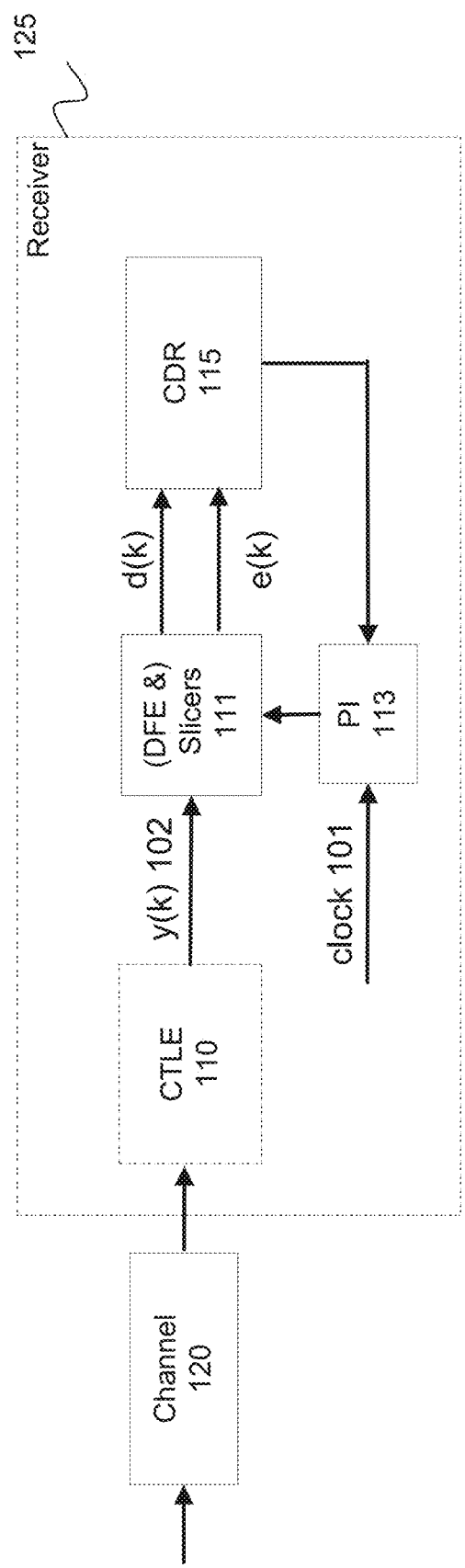
FIG. 1 is a block diagram depicting an example receiver, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. In one or more examples, a frequency offset may be detected and used in clock recovery in a SerDes system in asynchronous communications. In one or more examples, the extraction of timing information (e.g., where the locking point is) may be performed by creating extra error slicers to generate different CDR voting profiles, where these voting profiles differentiate in time. In one or more examples, frequency information may be extracted from the CDR voting profiles by dividing up the entire unit interval (UI) into different voting states and obtaining frequency offset information based on a detected change in voting state.

In one or more examples, CDR circuitry includes a frequency detector (FD) that can detect a frequency offset to a significantly greater extent than conventional CDRs. In one or more examples, the detectable frequency offset range is not limited by CDR bandwidth, and thus broadens the frequency acquisition range. Accordingly, in one or more examples a SerDes provided with the enhanced CDR circuitry may operate with greater robustness in an asynchronous communications system.

In some examples, CDR circuitry is augmented by additional logic to generate, in addition to a data signal and an error signal, at least two additional error signals. The additional error signals each add an offset to the DFE (or FFE, as the case may be) co-efficient in the standard error expression. In one or more examples, the CDR circuitry also has an FD configured to receive the data signal, the error signal and the at least two additional error signals, and output an FD signal, the FD signal added, after amplification, to a frequency path of the CDR circuitry.

FIG. 1 is a block diagram 100 depicting an example conventional receiver 125, according to an example. With reference thereto, the conventional receiver may receive a serial signal over a channel 120, which may be input to a continuous-time linear equalizer (CTLE) 110. The output of the CTLE 110 may be a post-equalization signal y(k), which may be fed into multiple clocked-slicers 111 to recover each of a data signal d(k), which indicates a logic level of the transmitted signal, and an error signal e(k), which indicates a received and equalized signal amplitude. The multiple clocked-slicers 111 may be integrated with another equalizer, which may be, as shown, a decision feedback equalizer, or which may be, in alternate receivers, a feed-forward equalizer (FFE) (not shown in FIG. 1). From the multiple slicers, or the integrated multiple slicers and DFE, as shown, the two signals d(k) and e(k) are then input to a CDR circuit 115 (shown within the dashed rectangle). CDR circuit 115 processes the data and error signals to generate a decision that is input to a phase interpolator (PI) 113, which adjusts the sampling phase clock 101 to achieve clock recovery. PI 113 thus provides an adjusted clock to slicers 111.

Figure 2:
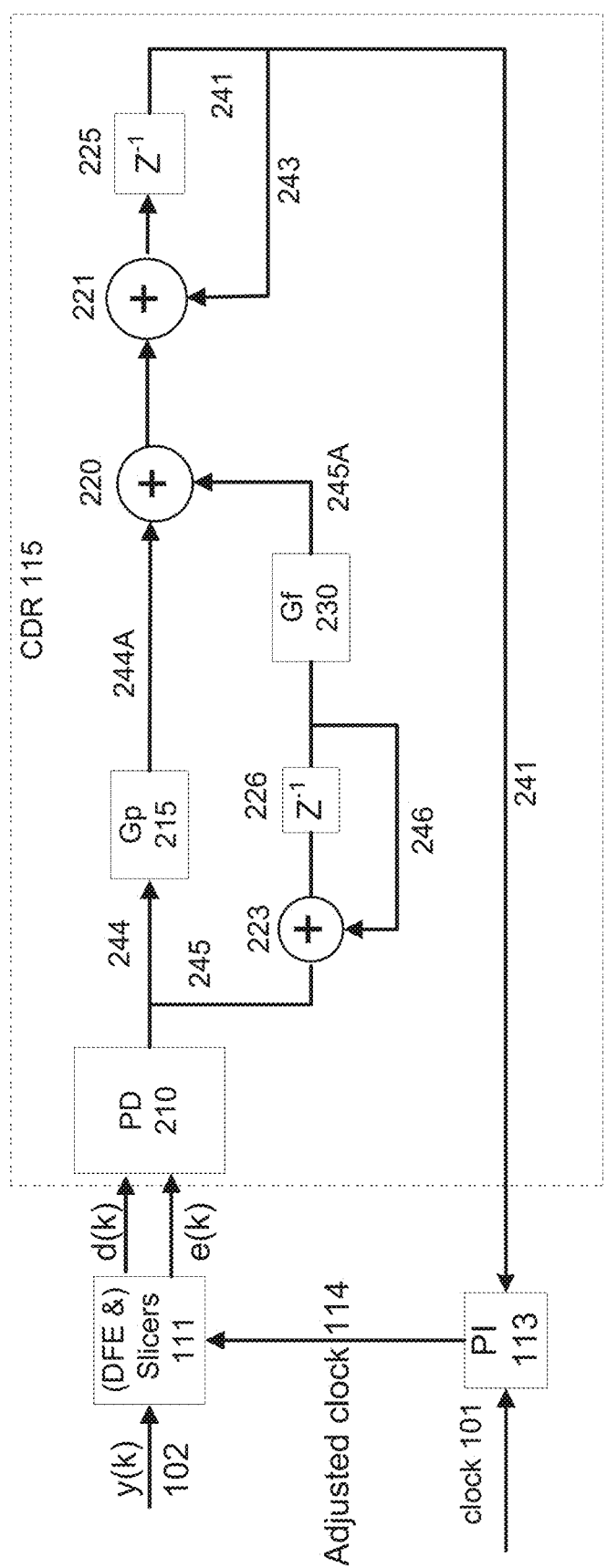
FIG. 2 is a more detailed block diagram of the receiver of FIG. 1.

FIG. 2 is a more detailed block diagram 200 of the conventional receiver of FIG. 1. Block diagram 200 of FIG. 2 illustrates internal details of the CDR circuit 115. With reference thereto, the d(k) and e(k) signals generated by DFE and slicers 111 are input to a phase detector (PD) 210. PD 210 generates a vote to increase or decrease the phase location, that is sent to two parallel paths within the CDR 115, a first order (or "phase") path 244, and a second order path (also known as the "frequency path" or "integral path") 245. With reference to the first order path 244, the output of PD 210 is multiplied by a phase path gain Gp 215, the output 244A of which is then input to a first summer 220. With reference to the second order path, the output of PD 210 is input, together with a delayed version of itself that is obtained from delay 226, to a second summer 223. The output of the second summer 223, after being delayed at delay 226, is multiplied by a frequency path gain Gf 230, and then input to the first summer 220. Thus, at first summer 220 the phase path signal and the frequency path signal are joined. In the second order loop 223-226-246, the output of summer 223 is fed to the delay 226, the output of which is then fed back at path 246, to summer 223. Thus, elements 223, 226, and 246 are essentially an integrator, which sums up the output of PD 210. For example, if a string of successive PD 210 outputs are, successively +1, +1, +1, +1, +1, then the value of the signal at the output of delay 226, and thus in path 246, will be 0, 1, 2, 3, 4 and 5.

Continuing with reference to FIG. 2, the output of the first summer 220 is then input to a third summer 221. Additionally, the output of the third summer 221 is sent to delay 225, and fed back, over path 243, to third summer 221. The output of delay 225 is also sent, over path 241, to PI 113, which adjusts clock 101 as described above with reference to FIG. 1, and thus provides an adjusted clock signal to the DFE and slicers 111. Thus, in the CDR locked state, the phase path, over links 244, 244A, tracks the instantaneous phase difference between the received data and the local clock within its loop bandwidth and loop gain range, while the frequency path, over links 245, 245A, periodically updates the PI 113 to track the averaged frequency offset within its tracking range.

It is noted that the CDR PD 210 only provides the phase difference information, and can usually only track a small frequency difference, measured in parts per million (ppm). When the frequency difference between the transmitted signal and the local clock is outside of the CDR frequency capture range, which is typically near the CDR bandwidth at a few MHz, which corresponds to a couple hundred ppm at 50+Gbps, using the PD, the CDR will lose lock due to limited CDR bandwidth and the link will fail. In one or more examples, this problem may be remedied by adding a frequency detector, as well as additional logic to supply it with additional error signals, as next described.

In one or more examples, a frequency detector (FD) may be added to the second order loop, or frequency loop, of a CDR that can detect the frequency offset to a much larger amount, and that is not limited by CDR bandwidth. In one or more examples, as a result, the frequency acquisition range of a CDR is significantly broadened. Thus, in one or more examples, a SerDes may be made to work more robustly in an asynchronous system, by using an FD to achieve reliable frequency acquisition. In one or more examples, additional error information and frequency detection logic is also provided, to support the functionality of the FD.

Figure 3:
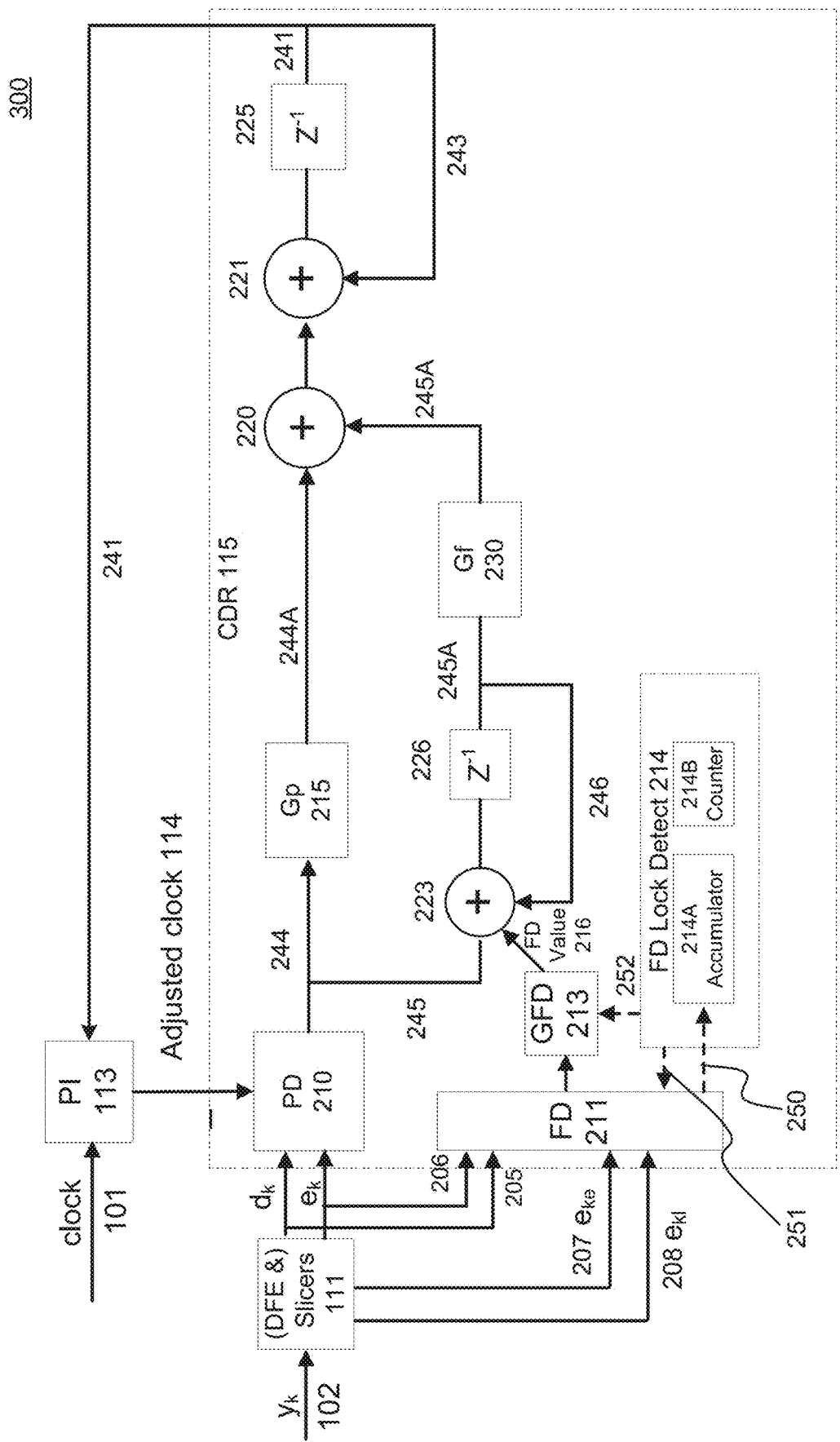
FIG. 3 is a block diagram of a receiver including a frequency detector in its CDR circuitry, according to an example.

FIG. 3 is a block diagram of a receiver 300 that includes a frequency detector in its CDR circuitry, according to an example. The example receiver of FIG. 3 is similar to that of FIG. 2, but the example receiver of FIG. 3 also includes an FD and related circuitry. To the extent that elements of receiver 300 have already been described with reference to FIG. 2, they are not once again described with reference to FIG. 3.

Turning now to FIG. 3, CDR 115 has an FD 211 whose output is ultimately added (after multiplication) to the frequency path 245, 245A, at summer 223. FD 211 receives various signals from DFE and slicers 111. These signals include a data signal $d_k$ 205, a first error signal $e_k$ 206, and, in this example, two additional error signals, $e_{ke}$ 207 (which stands for "error early") and $e_{kl}$ 208 (which stands for "error late"). These signals are each calculated as follows, assuming, for example, a one-tap DFE:

$d_k 205 = d_k$, $e_k 206 = \text{sign}[y_k - d_{k+1}*(h_1) - d_k*h_0]$, $e_{ke} 207 = \text{sign}[y_k - d_{k+1}*(h_1 + h_{1e0}) - d_k*h_0]$, and $e_{kl} 208 = \text{sign}[y_k - d_{k+1}*(h_1 + h_{1l0}) - d_k*h_0]$, where $y_k$ 102 is a kth received signal,
$d_k$ 205 is a (k)th recovered data and $d_{k+1}$ is a (k+1)th recovered data,
$h_0$ is a main cursor,
$h_1$ is a DFE co-efficient, and
$h_{1e0}$ and $h_{1l0}$ are an early offset and a late offset, relative to $h_1$, respectively.

Figure 4:
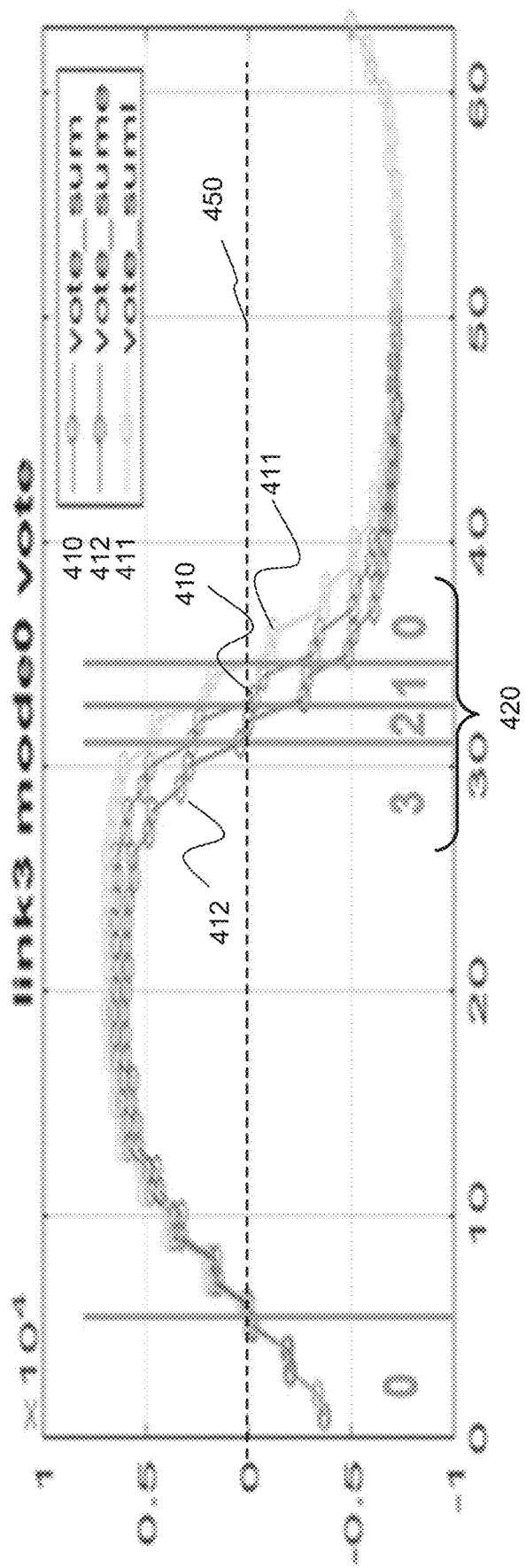
FIG. 4 depicts a set of plots of the $e_k$, $e_{ke}$ and $e_{kl}$ signals shown in FIG. 3, according to an example.

In one or more examples, $h_{1e0}$ and $h_{1l0}$ are system input parameters that can be programmed. Typical values for these offsets may be for example, +2 and −2 respectively. In general, the larger the offset, the wider are the state 2 and state 1 as shown in FIG. 4 (e.g., the middle states of the plot), or, in other words, the greater the separation between the early curve 412 from standard error curve 410, and the greater the separation of late curve 411 from standard error curve 410. In one or more examples, it is desired to have a wider state 2 and a wider state 1 so that the extreme states, state 0 and state 3, may be separated more easily. However, it is noted, if the offsets $h_{1e0}$ and $h_{1l0}$ are too large, then the early curve 412 and the late curve 411 may be distorted so much that they never give positive or negative votes, and, as a result, state 3 or state 0 will effectively disappear. In one or more examples, the most optimal offset will depend on the channel. However, it is noted, for a variety of channels that were tested by the inventors hereof, using the values +2 and −2 for the offsets $h_{1e0}$ and him worked quite well. In one or more examples, $h_1$ may be from 5% to 40% of $h_0$, which may be from 50 to 100 mV.

It is noted that conventionally, an error signal such as $e_k$ is calculated for the case of a 1-tap DFE where $y_k$ is the kth received signal before DFE processing. If a given system does not have a DFE, then the error is generally calculated with $h_1 = 0$ in the above provided equation. However, as noted above, in one or more examples, in addition to a data signal $d_k$ and a conventional error signal $e_k$, at least two additional error signals are generated in addition to the standard data symbol ($d_k$) and error symbol ($e_k$) that a CDR may use for the baud-rate clock recovery. In one or more examples, as next described, the FD uses these two additional error symbols to detect the direction of the symbol slip (when there is a frequency offset between the transmitter and the receiver) and then generates a frequency vote. In one or more examples, the frequency vote is added in the frequency path of the CDR after being multiplied by a user-defined frequency detector gain (GFD). In some examples, the gain factor GFD may be from $2^0$ to $2^{15}$, for example.

In the example equations for two additional error signals provided above, an $h_1$ offset is used because the CDR vote equation depends on the residual inter-signal interference (ISI) from the previous data. Thus, the additional offsets $h_{1e0}$ and him are equivalent to adding extra residual ISI, and can therefore shift the locking locations. If the CDR equation is correlated to the residual ISI from other taps, then other taps may be added accordingly.

The example error equations provided above are for examples in which a DFE is used, as shown in FIG. 3, and, for example, where the DFE has one tap. However, in alternate examples, where instead of a DFE, a feed-forward equalizer (FFE) is used, and there are two additional error signals, similar equations may be used for the various error signals, as follows:

$d_k 205 = d_k$, $y_k = y_k$, $e_k 206 = \text{sign}[y_k + y_k + 1*(f_1) - d_k*h_0]$, $e_{ke} 207 = \text{sign}[y_k + y_k + 1*(f_1 + f_{1e0}) - d_k*h_0]$, and $e_{kl} 208 = \text{sign}[y_k + y_k + 1*(f_1 + f_{1l0}) - d_k*h_0]$, where $y_k$ 101 is a (k)th received signal and $y_{k+1}$ is a (k+1)th received signal,
$d_k$ 205 is a (k)th recovered data,
$h_0$ is a main cursor,
$f_1$ is an FFE co-efficient, and
$f_{1e0}$ and $f_{1l0}$ are an early offset and a late offset, relative to the FFE co-efficient $f_1$, respectively.

As may be seen by comparing the example DFE and FFE equations, in the example FFE equations provided above, $d_{k+1}$ is replaced with $y_k + i$, the DFE coefficient $h_1$ is replaced with the FFE coefficient $f_1$ and the DFE $h_1$ offsets $h_{1e0}$ and $h_{1l0}$ are replaced with the FFE $f_1$ offsets $f_{1e0}$ and $f_{1l0}$. In one or more examples, $f_1$ may be from −5% to −40% of $h_0$, which, as noted above, may be from 50 to 100 mV.

Continuing with reference to FIG. 3, FD 211 processes the four example input signals which it receives, namely $d_k$, $e_k$, $e_{ke}$ and $e_{kl}$, to generate an FD output. In one or more examples, generating the FD output is a two-stage operation. First a phase vote is generated from the value of each of the three error signals. The phase votes of each error signal collectively determine a state of the received signal. Second, using changes in the state of the signal, the FD output is generated. This two-stage process is next described in detail, according to some examples. Also shown in FIG. 3 is an optional element, FD lock detect 214. In one or more examples, FD 211 may be turned off altogether once frequency acquisition (lock) is completed. This optional element FD lock detect 214, and how it may operate in one or more examples, is described in detail below with reference to FIG. 8.

Continuing still further with reference to FIG. 3, in one or more examples, the PD 210 (of CDR 115) takes the $d_k$ and $e_k$ signals to generate a phase vote(k) using, for example, the Mueller Muller algorithm, or, for example, any other baud-rate CDR algorithm, such as, for example, slope-error based baud rate CDR Taking non-return to zero (NRZ) signaling as an example, the voting logic may be given by:

$\text{vote}(k) = \text{sign}\{e_k*(d_{(k-1)} - d_{(k+1)})\}$

In one or more examples, FD 211 takes $d_k$, and the additional error signals, in this example the two additional error signals $e_{ke}$ and $e_{kl}$, to generate the additional vote signals vote_e(k) and vote_l(k) using analogous voting logic, as follows:

$$\text{vote\_e}(k) = \text{sign}\{e_{ke} * (d_{(k-1)} - d_{(k+1)})\}$$

$$\text{vote\_l}(k) = \text{sign}\{e_{kl} * (d_{(k-1)} - d_{(k+1)})\},$$

where the added offset in each of $e_{ke}$ and $e_{kl}$ changes the "target" CDR locking point, and thus changes the CDR voting profile. This is illustrated in FIG. 4, next described.

It is first noted that although element 111 of FIG. 3 is described as "DFE and slicers", it is not necessary that there be an equalizer at all, and thus no DFE or FFE is needed. Thus, in alternate examples, there may simply be additional error slicers provided, and no DFE or FFE used. In such alternate examples, the received errors may be screened or filtered from these additional error slicers based on the previous data. For example, for an NRZ signal, with an original error slicer "e", there may be added four additional error slicers "e+de_early", "e+de_late", "e−de_early" and "e−de_late", where "de_early" and "de_late" are offsets used for the additional early and late error slicers. Thus, for example, when the previously received data is "+1", the error slicer "e+de_early" and "e+de_late" outputs are valid, while the outputs from "e−de_ealry" and "e−de_late" are invalid. Similarly, the opposite is true when the previously received data is a "−1", e.g., the error slicer "e+de_early" and "e+de_late" outputs are invalid, while the outputs from "e−de_early" and "e−de_late" are valid.

In such alternate examples, where no DFE or FFE is used, then in the equations presented above for the error measures $e_k$, $e_{ke}$ and $e_{kl}$, $h_1$ may simply be set to equal 0.

FIG. 4 depicts a set of plots of the example $e_k$, $e_{ke}$ and $e_{kl}$ signals of the example of FIG. 3 over a unit interval (UI). With reference to FIG. 4, the vote signal associated with the (conventional) error signal $e_k$ is plotted in the center curve 410, and labeled "vote_sum" as shown in the key provided in the upper right of the figure. Center curve 410 is at the zero crossing point at the $32^{nd}$ sample of the UI, which is exactly one-half of the UI. The vote signal associated with the additional error signal $e_{ke}$ is plotted in the leftmost curve 412, and labeled "vote_sume" as shown in the key provided in the upper right of the figure. Finally, the vote signal associated with the error signal $e_{kl}$ is plotted in the rightmost curve 412, and labeled "vote_suml" as shown in the key provided in the upper right of the figure. As seen on FIG. 4, the "early" vote signal 412 leads the conventional error signal 410, and the "late" vote signal 411 lags the conventional error signal 410, as expected.

In one or more examples, given the existence of at least three vote signals, based on the corresponding at least three error signals, according to one or more examples, the UI shown in FIG. 4 may be divided into four regions, or frequency "states" 420 as shown. The states are differentiated by how many of the three vote signals are above the zero voltage line 450, and how many are below it. A first state, State 0, is when all three vote signals 410, 411 and 412 are below it, and thus have a negative value. A second state, State 1, is when the two signals 410 and 412 are below line 450, and thus negative, but the "early" vote signal 411 is either zero or positive. A third state, State 2, is when the "early" signal 412 is either negative or zero, and the two signals 410 and 411 are greater than or equal to zero. Finally, a fourth state, State 3, is when all three vote signals 410, 411 and 412 are on or above the zero voltage line 450, and thus have a value greater than or equal to zero. An example truth table that maps the values of each of signals 412, 410 and 411 to a corresponding state is shown in FIG. 5.

Conceptually, the CDR vote equations express the difference between the error signal and either the previous or the future data. By adding an offset to the error slicer, the correlation between the error and the previous data is changed. Thus, for example, $e_{ke}$ and $e_{kl}$ are associated with $h_{1e0}$ and $h_{1l0}$, respectively, and hence bias the voting curve $e_k$, pushing it either to the left (to generate "early" curve 412) or to the right (to generate "late" curve 411), as shown in FIG. 4).

It is noted with reference to FIGS. 3 and 4 that in alternate examples to the example CDR circuit illustrated in FIG. 3, whose two additional error signals result in the plots shown in FIG. 4, different numbers of additional error slicers may be added than two. Thus, for example, if more than two error slicers are added, then the state space, as illustrated in FIG. 4, will be extended, resulting in anywhere from two states to six states, or even more. In such cases each state is defined by how many of the error signals (both the conventional $e_k$ and the additional error signals $e_{kx}$) are above the zero voltage line 450. In each such alternate example, there will be one state where all of the error signals are >0, which will be at the far left of a plot analogous to that shown in FIG. 4, and there will be another state where all of the error signals are <0, which will be at the far right of a plot analogous to that shown in FIG. 4.

For example, if four additional slicers are added, then there would be a total of six states, namely 5|4|3|2|1|0. In such an example, a transition from state 5 to state 0, or from state 0 to state 5 would indicate a bit slip. Similarly, the "3" in FIG. 6 would be replaced with a "5". In such an alternate example, the added slicers/states would provide more detailed information as to where the locking location is within the one UI space, and, for example, this information may be used to extract the frequency drifting rate, etc. On the other hand, in yet other alternate examples, if the number of additional slicers is only one, then there would be a total of three states, and if the number of additional slicers is three, there would be four total states, namely 4|3|2|1|0, etc.

FIG. 5 depicts a truth table that may be used to determine a frequency state according to an example where there are two additional error signals, and thus three error plots, and four states altogether. FIG. 5 thus illustrates the four states 0-3, in the "state" column 510, for each combination of the vote signals 412, 410 and 411, as described above. The truth table of FIG. 5 thus summarizes the output of the first stage of the FD output calculation. The second stage, as noted, involves detection of certain key state transitions. This is next described with reference to FIG. 6.

FIG. 6 is a state transition table that may be used to generate a FD output according to an example. As shown, the left column 601 includes three possible transitions, and for each case a different FD output 605 is generated. Only two state transitions trigger a nonzero FD output, namely from state 3 (all error signals >0) to state 0 (all error signals <0), or the reverse transition, from state 0 to state 3. In all other cases, the FD output is 0. When there is a state transition between state 0 and state 3, UI bit slip is detected. Moreover, states 1 and 2 are reduced to one state ("else") as the FD output does not depend on either state 1 or state 2. Beginning with the top row of FIG. 6, a transition from state 0 to state 3 generates an FD output of −1, and a transition from state 3 to state 0 generates an FD output of +1. Every other transition, or absence of any transition, e.g., from starting in state 2 and remaining in state 2, generates a 0 as the FD output. The FD outputs 605 are thus the second stage, and thus the final, outputs of the FD.

Referring once again to FIG. 3, in one or more examples the output of FD 211 is input to a multiplier 213, which multiplies the FD output by a user-defined factor GFD to generate an FD value 216. In some examples, GFD may be $2^{13}$. GFD should be set to be large enough such that it can overwrite wrong votes coming from the PD 210 at the summer 223. At the same time, it should not be set to be too large because the vote may be pattern dependent, and thus may potentially dither the code at the output of delay 226 significantly, affecting performance. The output of the multiplier 213, which is the FD output of 1, 0 or −1, as noted above, is then input to the first summer 223 where it is also added to the frequency loop of CDR 115.

Conceptually, given the example error signals of FIG. 4, the truth table of FIG. 5, and the state table of FIG. 6, in one or more examples, the frequency information is extracted from the CDR voting profiles and the frequency offset information obtained. In particular, the state 3121110 shown in FIG. 4 indicates where a current CDR locking location is. The desired locking location is between states 1 and 2, which is at the center of the "eye", or where the signal amplitude is the best. If the state is switched from state 3 to state 0, that means the local sampling clock is drifting relative to the incoming data, and thus the local sampling clock frequency is too fast. When the local sampling clock frequency is too fast for the received data, it samples earlier and earlier, and eventually samples the same data twice—a first time at the beginning of the data interval (hence the CDR is in state 3 "too early"), and a second time at the end of the data interval (and thus the CDR is in state 0 "too late"). So once the state transition is detected, the FD output is 1, which will keep increasing the PI code, which in turn delays the clock phase, effectively slowing down the local clock, and bringing it closer to the actual clock of the received data.

On the other hand, if the state is switched from state 0 to state 3, that means the local clock is now too slow. Thus, it samples the data later and later, and eventually falls so behind that it skips one datum, and does not sample it. The FD detects that and outputs a −1, which decreases the PI code, and, in turn, advances the clock phase, effectively speeding up the local clock, and bringing it closer to the actual clock of the received data.

In alternate examples, where more or less than two additional slicers are used, the procedure is equivalent. Thus, for example, for the case of one additional slicer, with reference to FIG. 4, there would be two error signals in total, for example, the original plotted at 410, and one additional error signal, either plot 412 or plot 411, for example. For example, if the additional error signal is plot 411, then there is only one additional zero-crossing voting profile, and thus states 0, 1 and 3, where state 2 of FIG. 4 is now merged into state 3, and in state 3 the two plots are above the x=0 line. In this example, with the just one additional error signal, it is still possible to determine how the CDR moves. Thus, if the CDR local clock frequency is faster, it will move through the states as 0→1→3→0→1→3, and the transition from 3 to 0 will be detected. On the other hand, if the CDR local clock frequency is slower, the transitions will be as follows: 0→3→1→0→3, and the transition from state 0 to state 3 will be detected.

It is noted that for PAM4 signaling, the phase detection logic is more complicated, but the same concept may still be applied. In one or more examples some pattern filtering might be needed to achieve the best voting profile segmentation. For example, one approach is to look for NRZ-like patterns, e.g., [1, 1, −1 or −3, −3, +3] and only use votes from those patterns for FD. In addition, in one or more examples, techniques according to the present disclosure may also be used for other modulation schemes besides NRZ and PAM4, such as, for example, PAM8, DSQ, duo binary, etc. In order to implement those, in one example the patterns that are desired to be used may be selected, and extra error slicers added that only target those levels. For example, for PAM8, one may select a 1,1,−1 transition and add extra two error slicers only associated with these levels.

Figure 7:
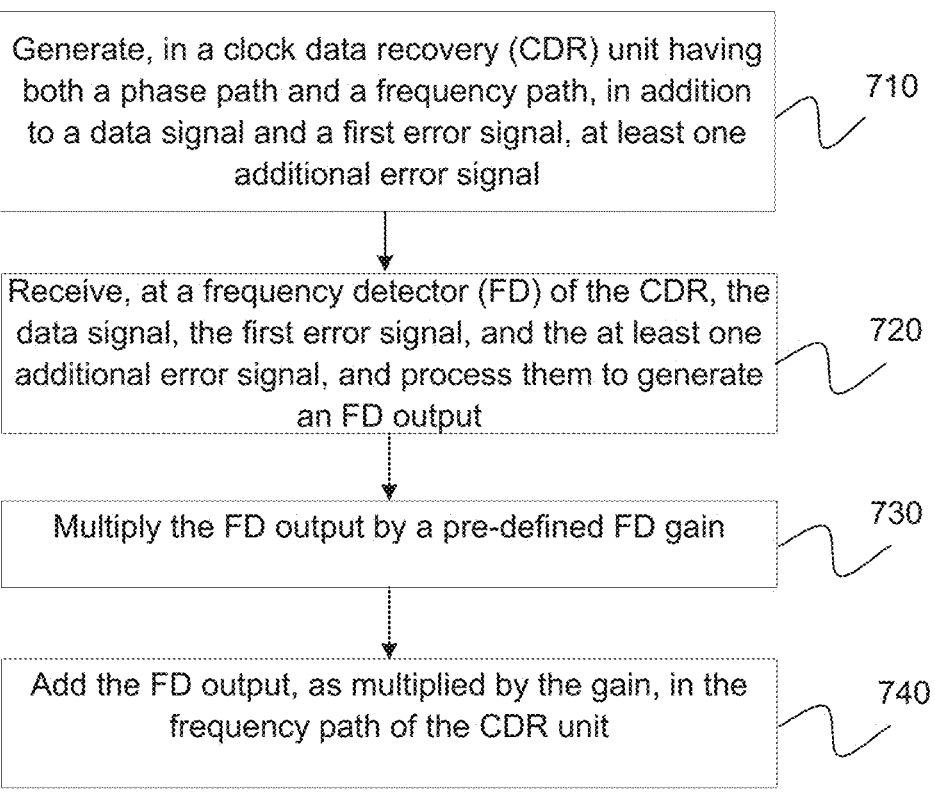
FIG. 7 is a flow diagram depicting a method of clock and data recovery according to an example.

FIG. 7 is a flow diagram depicting a method 700 of clock and data recovery according to an example. The method includes blocks 710 through 740. In alternate examples of the method, there may be greater, or fewer, blocks. The method 700 begins at block 710, where, in a CDR unit having both a phase path and a frequency path, in addition to a data signal and a first error signal, at least one additional error signal is generated. For example, there may be two additional error signals, and they may be the signals $e_{ke}$ and $e_{kl}$, as described above with reference to FIG. 4, each including an offset to a DFE or FFE co-efficient of a next recovered data term $d_{K+1}$.

From block 710 method 700 moves to block 720, where, at a FD of the CDR unit, the data signal, the first error signal, and the at least one additional error signal are received, and processed to generate an FD output. For example, as described above with reference to FIGS. 4-6, for the example of two additional error signals (plotted as 411 and 412 in FIG. 4) the FD output may be a 1, 0 or −1, depending upon detection by the FD of a state transition from a state at one side of the UI, such as, for example, state 3 of FIG. 4, to a state at the other side of the UI, such as, for example, state 0 of FIG. 4, is detected, in either direction. For example, such state transitions are those that indicate UI bit slip.

From block 720 method 700 moves to block 730, where the FD output is multiplied by a pre-defined FD gain. For example, the FD gain may be user-defined, and may be a function of the PD gain. In some examples it is desired that the FD vote dominate the PD vote, and thus the FD gain be somewhat larger than the PD gain. In some examples, as the CDR gets frequency locked, the FD gain may be reduced, or even set to 0. Thus, the FD gain may also be a function of time. In one or more examples, as a precaution, the FD gain may be reduced as opposed to being completely shut-off just in case there is some instantaneous frequency perturbation or offset that the FD loop cannot immediately track. Thus, having the FD on, even with reduced gain, the frequency can recover more quickly than if only the PD is on.

From block 730 method 700 moves to block 740, where the FD output, as multiplied by the FD gain, is added in the frequency path of the CDR unit. For example, as shown in FIG. 3, the output of FD 211, after being multiplied by GFD at multiplier 213, is added to the first summer 223, which is in the frequency path of CDR 115, as described above. Method 700 terminates at block 740.

FIG. 8 is a flow diagram depicting alternate method 800 of clock and data recovery according to an example. The method includes blocks 810 through 850. In alternate examples of the method, there may be greater, or fewer, blocks. The method 800 begins at block 810, where, in a decision feedback equalizer (DFE) a of clock data recovery (CDR) unit, a data signal d(k), an error signal $e_k$, an early error signal, $e_{ke}$ and a late error signal $e_{kl}$, are generated, as follows:

$$e_k = \text{sign}[y_k - d_{k+1} * (h_1) - d_k * h_0],$$

$$e_{ke} = \text{sign}[y_k - d_{k+1} * (h_1 + h_{1e0}) - d_k * h_0], \text{ and}$$

$$e_{kl} = \text{sign}[y_k - d_{k+1} * (h_1 + h_{1l0}) - d_k * h_0],$$

where $h_1$ is a co-efficient of the DFE, and $h_{1e0}$ and $h_{1l0}$ are early and late offsets, respectively, relative to $h_1$. For example, the additional early and late error signals may be used to extract timing information, by generating different CDR profiles.

From block 810 method 800 moves to block 820, where a FD of the CDR receives each of the d(k), $e_k$, $e_{ke}$ and $e_{kl}$ signals, and respectively processes the early and late error signals to generate corresponding phase voting signals vote_e(k) and vote_l(k), as follows:

$$\text{vote\_}e(k) = \text{sign}(e_{ke} * (d_{k-1} - d_{k+1})) \text{ and}$$

$$\text{vote\_}l(k) = \text{sign}(e_{kl} * (d_{k-1} - d_{k+1})).$$

For example, the voting profiles vote_e(k_ and vote_l(k) differentiate in time, and may be used to facilitate obtaining frequency offset information of the incoming data signal.

From block 820 method 800 moves to block 830, where, in the FD a state is generated from the vote_e(k) and vote_l($k$) signals in combination with a vote(k) signal=sign ($e_k * (d_{k-1} - d_{k+1})$), the vote(k) signal generated from the $e_k$ signal, wherein in a first state all three signals are negative, and in a second state all three signals are positive. For example, the first state may be state 0 of FIG. 4, and the second state may be state 3 of FIG. 4, described above with reference to FIGS. 4 and 5.

From block 830 method 800 moves to block 840, where the FD generates an output of 1 when the state changes from the first state to the second state, −1 when the state changes from the second state to the first state, and 0 at all other times. For example, the FD output may be the FD output 605 of FIG. 6, described above.

From block 840 method 800 moves to block 850, where the FD output generated in block 840 is added to an integral path of the CDR. For example, as described above with reference to FIG. 3, the output of FD 211, after being multiplied by GFD at multiplier 213, is added to the first summer 223, which is in the frequency or integral path of CDR 115. Method 800 terminates at block 850.

As noted above, in one or more examples the FD gain GFD may be reduced, or the FD 211 turned off altogether, once frequency acquisition is completed. In such examples, frequency acquisition may be detected by the FD output having a zero average over time, for example, as measured by a pre-defined number of cycles. Once frequency acquisition is detected, the frequency tracking can be taken over solely by the phase detector of the CDR, and the FD automatically shut-off. As noted above, to implement this automatic shut-off, an optional FD lock detector may be added to the CDR circuitry of FIG. 3. Accordingly, turning once again to FIG. 3, the optional element FD lock detect 214 is shown. FD lock detect includes an accumulator 214A, configured to store the output of the FD 211, which is, as described above, either a 1, a −1 or a 0, depending upon if the error signals have switched from being all positive to all negative, or vice versa. FD lock detect 214 may receive the FD 211 output over link 250, and store it in accumulator 214A. In one or more examples, FD lock detect 214 also includes a counter 214B, which may store the number of cycles of the CDR in a given FD lock detection cycle. Thus, in one or more examples, FD lock detect 214 receives the output of FD 211 and stores it in accumulator 214A, for a pre-defined number of cycles that are tracked by counter 214B. Once the pre-defined number of cycles have passed, it is determined by FD lock detect 214 if the CDR circuit 115 has locked onto the frequency of the incoming data signal $y_k$ 102, such as, for example, by seeing an average FD output of 0, or close to 0 within some threshold, over the pre-defined number of cycles. In response to a determination that there has been a frequency acquisition (lock), the FD lock detect 214 may either reduce the GFD (and then be able to increase it again if needed) by a control signal sent over link 252, or simply shut-off FD 211 altogether, via a control signal sent over link 251, so that no FD output is generated at all.

In one or more examples, FD lock detect 214 may operate as follows. In one or more examples, for every cycle, there may be one FD vote. An accumulated sum called "FD_vote_sum" may store the sum of all of the FD votes for as many cycles as are provided by a pre-determined value "Cycle_thr", which may be, for example, 10,000 cycles. With reference to FIG. 3, counter 214B may be used to track the amount of FD cycles that have elapsed in any FD lock detection round. When the counter reaches the value of "Cycle_thr", the absolute value of FD_vote_sum may be compared with a pre-determined value "Sum_thr", which determines how close the frequency is locked. The smaller the value of "Sum_thr", the closer the recovered clock frequency is to the incoming data frequency. A typical value of "Sum_thr" may be 20, for example. If the absolute value of "FD_vote_sum" is smaller than the value of "Sum_thr", then the recovered clock frequency is considered locked and the FD can be turned off. However, if the absolute value of "FD_vote_sum" is larger than the value of "Sum_thr", then the recovered clock frequency is deemed to be unlocked, and the accumulated value "FD_vote_sum" and the counter may both be reset to 0. At that point a new detection round is begun, and thus "FD_vote_sum" will again keep a tally of the accumulated FD votes, and the counter will keep the count of the number of vote cycles, and when the counter once again reaches the value of "Cycle_thr" the value of "FD_vote_sum" will be compared with the threshold "Sum_thr."

Figure 9:
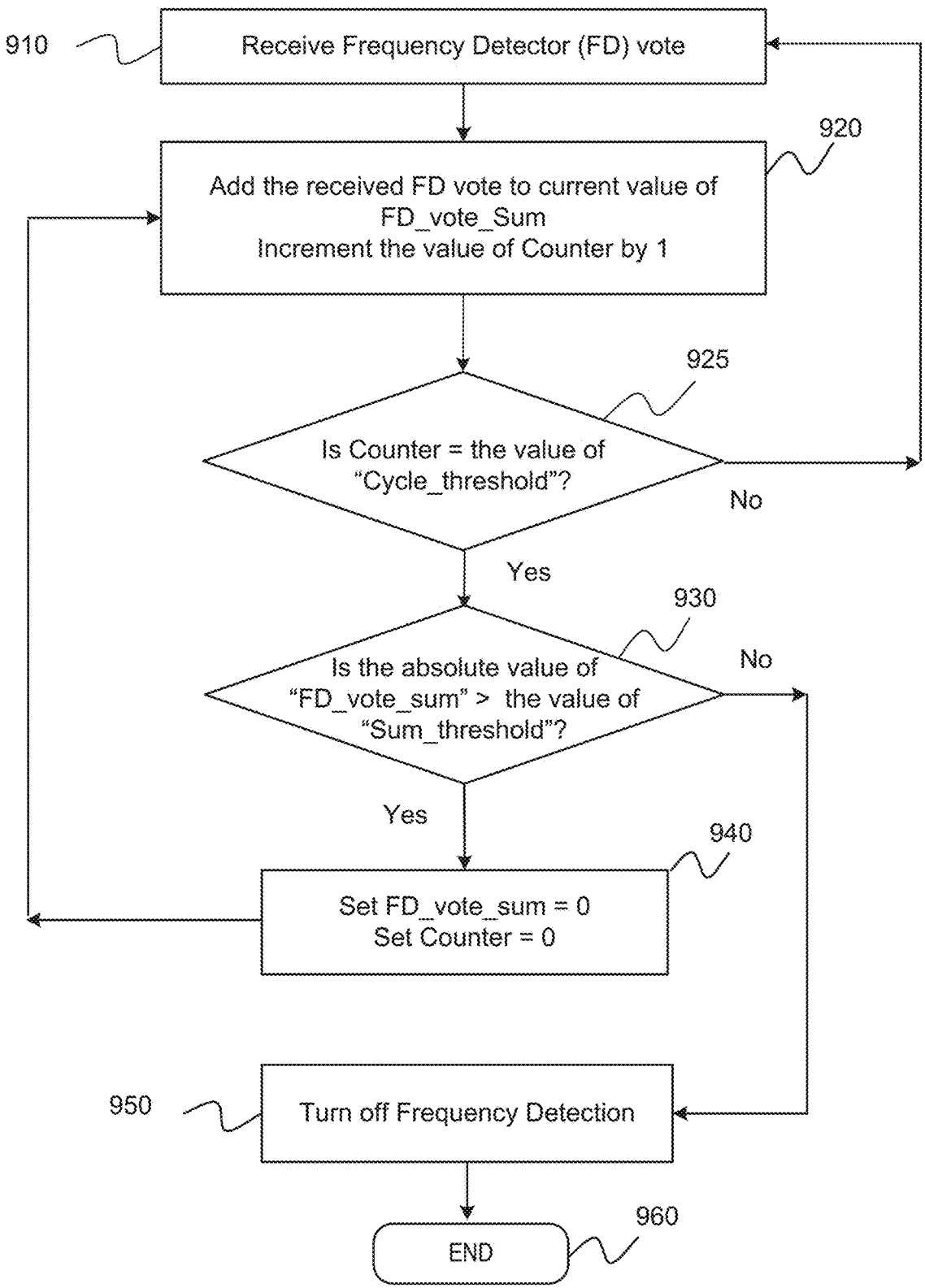
FIG. 9 is a flow diagram depicting a still alternate method of clock and data recovery, according to an example.

FIG. 9 is a flow diagram depicting a method 900 of frequency detector lock detection according to an example. The method includes blocks 910 through 960. In alternate examples of the method, there may be greater, or fewer, blocks. Method 900 may be performed, for example, by FD lock detect 214 of FIG. 3. The method 900 begins at block 910, where a FD vote is received from a FD of a CDR circuit.

From block 910 method 900 moves to block 920, where the received FD vote is added to an accumulator. For example, the accumulator may be accumulator 214A of FIG. 3, and it may store the succession of FD votes as a variable "FD_vote_Sum." At the same time, a counter may be incremented, so that a pre-defined number of cycles needed for a measurement may be tracked.

From block 920 method 900 moves to query block 925, where it is determined if the counter has reached the value of "cycle_threshold" which is a pre-defined number of cycles needed for an accurate average measurement. If the query at block 925 returns a "Yes", then process flow moves to query block 930, described below. However, if the return at query block 925 is "No", then there are not a sufficient number of cycles for a detection, and process flow returns to block 920.

At query block 930 it is determined if the absolute value of the accumulated sum of all FD votes, over the number of cycles equal to "cycle_threshold" exceeds a pre-defined threshold "Sum_threshold." If "Yes", then the FD vote average is not equal to or near 0, and there is still some bit slip, and the FD cannot yet be turned off. As a result, both the cycle counter and the "FD_vote_Sum" values are reset to zero, and process flow returns to block 920.

However, if a "No" is returned at query block 930, then the average FD vote is zero, of sufficiently close to it, to indicate that there is no bit slip, and the CDR's local clock has in fact locked onto the correct frequency of the incoming data stream. Thus, process flow moves to block 950, where frequency detection is turned off. For example, as described above with reference to FIG. 3, FD lock detect 214 may shut-off FD 211. Method 900 terminates at block 950.

Thus, in one or more embodiments, extra error slicers may be added to a CDR circuit, and the voltage/level information from these extra error slicers may be converted into timing (CDR locking location) information by a FD. The FD may then output a vote, based on a change in the values of all error slicers (both the conventional one, as well as the extra added ones) from all having negative values, to all having positive values, or vice versa. The vote is added to a second-order loop of the CDR circuit.

While the foregoing is directed to specific examples, other and further examples may be devised without departing from the basic scope thereof, and the scope thereof is determined by the claims that follow.

What is claimed is:

1. A circuit, comprising:
    slicer circuitry configured to output a data signal and a first error signal based on a received signal, and a second error signal based on the received signal and a first voltage offset;
    a clock and data recover (CRD) circuit, comprising,
        a phase detector (PD) configured to generate a PD output based on the data signal and the first error signal,
        a frequency detector (FD) configured to receive the data signal, the first error signal, and the second error signal, and to generate a FD output based on the received data signal, the received first error signal, and the received second error signal; and
    control circuitry configured to generate a clock control based on the PD output and the FD output.

2. The circuit of claim 1, wherein the first error signal includes a next data term with a feed forward equalizer (FFE) coefficient, and wherein the second error signal includes the next data term with a modified version of the FFE coefficient.

3. The circuit of claim 1, wherein the first error signal includes a next data term with a decision feedback equalizer (DFE) coefficient, and wherein the second error signal includes the next data term with a modified version of the DFE coefficient.

4. The circuit of claim 1, wherein:
    the slicer circuitry is further configured to output a third error signal based on the received signal;
    the FD is further configured to receive the third error signal and generate the FD output based further on the received third error signal;
    the first error signal is expressed as: $e_k=\text{sign}[y_k-d_{k+1}*(h_1)-d_k*h_0]$;
    the second error signal is expressed as: $e_{ke}=\text{sign}[y_k-d_{k+1}*(h_1+h_{1e0})-d_k*h_0]$;
    the third error signal is expressed as: $e_{kl}=\text{sign}[y_k-d_{k+1}*(h_1+h_{1l0})-d_k*h_0]$;
    $y_k$ is a kth received signal;
    $d_{k+1}$ is a (k+1)th recovered data;
    $h_0$ is a main cursor;
    h1 is a decision feedback equalizer coefficient;
    $h_{1e0}$ is an early offset relative to h1; and
    $h_{1l0}$ is a late offset relative to h1.

5. The circuit of claim 1, wherein:
    the slicer circuitry is further configured to output a third error signal based on the received signal;
    the FD is further configured to receive the third error signal and generate the FD output based further on the received third error signal;
    the first error signal is expressed as: $e_k=\text{sign}[y_k+y_{k+1}*(f_1)-d_k*h_0]$;
    the second error signal is expressed as: $e_{ke}=\text{sign}[y_k+y_{k+1}*(f_1+f_{1e0})-d_k*h_0]$;
    the third error signal is expressed as: $e_{kl}=\text{sign}[y_k+y_{k+1}*(f_1+f_{1l0})-d_k*h_0$;
    $y_k$ is a (k)th received signal;
    $y_{k+1}$ is a (k+1)th received signal;
    $d_k$ is a (k)th recovered data;
    $h_0$ is a main cursor;
    $f_1$ is an FFE coefficient;
    $f_{1e0}$ is an early offset relative to the FFE coefficient $f_1$; and
    $f_{1l0}$ is a late offset relative to the FFE coefficient $f_1$.

6. The circuit of claim 1, wherein the slicer circuitry is further configured to output a third error signal based on the received signal, wherein:
    the FD is further configured to receive the third error signal and generate the FD output based further on the received third error signal; and
    the FD output represents whether a local sampling clock is too fast or too slow relative to an incoming data stream.

7. The circuit of claim 1, wherein the slicer circuitry is further configured to output a third error signal based on the received signal, wherein the FD is further configured to receive the third error signal generate the FD output based further on the received third error signal, and wherein the FD output is:
    a negative number when the first, second, and third error signals change from being above zero volts to being below zero volts; and
    a positive number when the first, second, and third error signals change from being below zero volts to being above zero volts.

8. The circuit of claim 1, wherein the FD is further configured to:
    periodically compute a first frequency vote based on a voltage of the first error signal;
    periodically compute a second frequency vote based on a voltage of the second error signal;
    periodically determine a state based on current states of the first and second frequency votes; and
    generate the FD output based on a change in the state.

9. The circuit of claim 1, wherein the control circuitry comprises:
    a first order phase path configured to track a phase difference between the received signal and a local clock based on the PD output;
    a multiplier circuit configured to multiply the FD output by a first frequency path gain factor prior to a frequency lock condition, and to multiply the FD output by a second frequency path gain factor subsequent to the frequency lock condition, wherein the first frequency path gain factor is greater than the second frequency path gain factor;
a second order frequency path configured to track a frequency offset between the received signal and the local clock based on a sum of the PD output and an output of the multiplier circuit; and
a summing circuit configured to combine outputs of the first order phase path and the second order frequency path.

10. The circuit of claim 9, wherein:
the first order phase path comprises a phase path gain circuit having a phase path gain factor; and
the first frequency path gain factor is greater than the phase path gain factor.

11. A circuit, comprising:
a plurality of slicers configured to generate a data signal, a first error signal, and a second error signal based on a received signal; and
a clock and data recovery (CDR) circuit, comprising,
  a phase detector (PD) configured to generate a PD output based on the data signal, the first error signal, the second error signal, and a local clock;
  a frequency detector (FD) configured to generate a FD output based on, the data signal, the first error signal and the second error signal, including to,
    periodically compute a first frequency vote based on a voltage of the first error signal,
    periodically compute a second frequency vote based on a voltage of the second error signal,
    periodically determine a state based on current states of the first and second frequency votes, and
    generate the FD output based on a change in the state; and
  control circuitry configured to generate a clock control based on the PD output and the FD output.

12. The circuit of claim 11, further comprising a decision feedback equalizer (DFE), wherein the FD is further configured to generate the FD output based further on a third error signal, and wherein the first, second, and third error signals are expressed as:

$e_k = \text{sign}[y_k - d_{k+1}*(h_1) - d_k*h_0]$;

$e_{ke} = \text{sign}[y_k - d_{k+1}*(h_1 + h_{1e0}) - d_k*h_0]$; and $e_{kl} = \text{sign}[y_k - d_{k+1}*(h_1 + h_{1l0}) - d_k*h_0]$;

where,
$y_k$ is a kth received signal,
$d_{k+1}$ is a (k+1)th recovered data,
$h_0$ is a main cursor,
h1 a DFE coefficient,
$h_{1e0}$ is an early offset relative to h1, and
$h_{1l0}$ is a late offset relative to h1.

13. The circuit of claim 11, further comprising a feed-forward equalizer (FFE), wherein the FD is further configured to generate the FD output based further on a third error signal, and wherein the first, second, and third error signals are expressed as:

$e_k = \text{sign}[y_k + y_{k+1}*(f_1) - d_k*h_0]$;

$e_{ke} = \text{sign}[y_k + y_{k+1}*(f_1 + f_{1e0}) - d_k*h_0]$; and $e_{kl} = \text{sign}[y_k + y_{k+1}*(f_1 + f_{1l0}) - d_k*h_0]$;

where $y_k$ is a (k)th received signal,
$y_{k+1}$ is a (k+1)th received signal,
$d_k$ is a (k)th recovered data,
$h_0$ is a main cursor,
$f_1$ is an FFE coefficient,
$f_{1e0}$ is an early offset relative to the FFE coefficient $f_1$, and
$f_{1l0}$ is a late offset relative to the FFE coefficient $f_1$.

14. The circuit of claim 11, wherein the control circuitry comprises:
a first order phase path configured to track a phase difference between the received signal and a local clock based on the PD output;
a multiplier circuit configured to multiply the FD output by a first frequency path gain factor prior to a frequency lock condition, and to multiply the FD output by a second frequency path gain factor subsequent to the frequency lock condition, wherein the first frequency path gain factor is greater than the second frequency path gain factor;
a second order frequency path configured to track a frequency offset between the received signal and the local clock based on a sum of the PD output and an output of the multiplier circuit; and
a summing circuit configured to combine outputs of the first order phase path and the second order frequency path.

15. The circuit of claim 14, wherein:
the first order phase path comprises a phase path gain circuit having a phase path gain factor; and
the first frequency path gain factor is greater than the phase path gain factor.

16. A method, comprising:
generating a data signal and first error signal based on a received signal;
generating a second error signal based on the received signal and a first voltage offset;
generating a phase detector (PD) output based on the data signal and the first error signal;
generating a frequency detector (FD) output based on the data signal, the first error signal, and the second error signal, comprising,
  periodically computing a first frequency vote based on a voltage of the first error signal,
  periodically computing a second frequency vote based on a voltage of the second error signal,
  periodically determining a state based on current states of the first and second frequency votes, and
  generating the FD output based on a change in the state; and
controlling a local clock based on the PD output and the FD output.

17. The method of claim 16, wherein the controlling comprises:
tracking a phase difference between the received signal and a local clock based the PD output in a first-order phase path;
multiplying the FD output by a first frequency path gain factor prior to a frequency lock condition, and by a second frequency path gain factor subsequent to the frequency lock condition, wherein the first frequency path gain factor is greater than the second frequency path gain factor;
tracking a frequency offset between the received signal and the local clock based on a sum of the PD output and an output of the multiplier circuit in a second-order frequency path; and
combining outputs of the first order phase path and the second order frequency path to provide a local clock control.

18. The method of claim 17, wherein:
the first order phase path comprises a phase path gain circuit having a phase path gain factor; and
the first frequency path gain factor is greater than the phase path gain factor.

* * * * *